(12) United States Patent
Long

(10) Patent No.: US 11,569,476 B2
(45) Date of Patent: Jan. 31, 2023

(54) DISPLAY SUBSTRATE AND DISPLAY APPARATUS

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 16/961,903

(22) PCT Filed: Nov. 5, 2019

(86) PCT No.: PCT/CN2019/115730
§ 371 (c)(1),
(2) Date: Jul. 13, 2020

(87) PCT Pub. No.: WO2020/094015
PCT Pub. Date: May 14, 2020

(65) Prior Publication Data
US 2020/0388788 A1  Dec. 10, 2020

(30) Foreign Application Priority Data
Nov. 7, 2018  (CN) .......................... 201821833043.8

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 2251/301* (2013.01)

(58) Field of Classification Search
CPC ............. H01L 51/5253; H01L 27/3246; H01L 27/3258; H01L 21/56; H01L 2924/181; H01L 2224/833051; H05K 2201/09909
See application file for complete search history.

(56) References Cited

U.S. PATENT DOCUMENTS

| | | | |
|---|---|---|---|
| 10,170,534 B1* | 1/2019 | Kim | H01L 27/3223 |
| 2015/0060806 A1* | 3/2015 | Park | H01L 51/525 257/40 |
| 2016/0320646 A1 | 11/2016 | Lee et al. | |
| 2017/0365814 A1 | 12/2017 | Kim et al. | |
| 2018/0301524 A1 | 10/2018 | Luo et al. | |
| 2019/0088733 A1* | 3/2019 | Cho | H01L 51/5253 |

(Continued)

FOREIGN PATENT DOCUMENTS

| | | |
|---|---|---|
| CN | 106876609 A | 6/2017 |
| CN | 107204404 A | 9/2017 |
| CN | 206758439 U | 12/2017 |

(Continued)

OTHER PUBLICATIONS

Supplementary European Search Report for related Application No. EP 19881187, dated Jun. 28, 2022.

*Primary Examiner* — Fernando L Toledo
*Assistant Examiner* — Valerie N Newton
(74) *Attorney, Agent, or Firm* — Procopio, Cory, Hargreaves & Savitch LLP

(57) ABSTRACT

A display substrate includes a base substrate and an encapsulation film disposed at a first side of the base substrate. At least one corner of an edge of the encapsulation film is a rounded corner or a substantially rounded corner.

18 Claims, 5 Drawing Sheets

(56) References Cited

U.S. PATENT DOCUMENTS

2019/0140207 A1 5/2019 Li et al.
2020/0388788 A1 12/2020 Long

FOREIGN PATENT DOCUMENTS

| CN | 108232043 | A  | 6/2018 |
| CN | 208904069 | U  | 5/2019 |
| EP | 3188275   | A1 | 7/2017 |

* cited by examiner

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2019/115730 filed on Nov. 5, 2019, which claims priority to Chinese Patent Application No. 201821833043,8, filed on Nov. 7, 2018, titled "DISPLAY SUBSTRATE AND DISPLAY APPARATUS", which are incorporated herein by reference in their entirety.

TECHNICAL FIELD

The present disclosure relates to the field of display technologies, and in particular, to a display substrate and a display apparatus.

BACKGROUND

Active matrix organic light-emitting diode (AMOLED) display apparatuses have advantages such as thinness, lightness, a wide viewing angle; active luminescence, emitted light of continuous and adjustable color, low cost, a quick response speed, low energy consumption, a low driving voltage, a wide operating temperature range, a simple manufacturing process, and high luminescence efficiency.

In the AMOLED display apparatus, electrodes (such as a cathode) and organic functional layers (such as a light-emitting layer) of the organic light-emitting diode (OLED) apparatus is prone to be eroded by moisture and oxygen, which leads to a reduction of the service life thereof. Therefore, it is necessary to encapsulate the AMOLED display apparatus, Thin film encapsulation (TFE) is one of the commonly used encapsulation methods.

SUMMARY

In one aspect, a display substrate is provided. The display substrate includes a base substrate, and an encapsulation film disposed at a first side of the base substrate. At least one corner of an edge of the encapsulation film is a rounded corner or a substantially rounded corner.

In some embodiments, a radius $R_F$ of the rounded, corner of the edge of the encapsulation film satisfies $R_F=L\times\alpha_1$, where L is a length of a diagonal of the display substrate, and $\alpha_1$ is a coefficient related to the length of the diagonal of the display substrate.

In some embodiments, a value range of $\alpha_1$ is $0.001 \leq \alpha_1 \leq 0.004$.

In some embodiments, the encapsulation film includes at least one organic film layer. The display substrate has a display region and a bezel region surrounding the display region, the display substrate further includes at least one blocking dam disposed at the first side of the base substrate in the bezel region. The at least one blocking dam is disposed around the at least one organic film layer. Each blocking dam of the at least one blocking dam is configured to block the at least one organic film layer. At least one corner of the blocking dam rounded corner or a substantially rounded corner.

In some embodiments, a radius $R_d$ of a rounded corner of the blocking dam satisfies: $R_d=L\times\alpha_2$, where L is the length of the diagonal of the display substrate, and $\alpha_2$ is a coefficient related to the length of the diagonal of the display substrate.

In some embodiments, a value range of $\alpha_2$ is $0.001 \leq \alpha_2 \leq 0.004$.

In some embodiments, at a same corner position of the display substrate, a corner of the edge of the encapsulation film and a corner of the blocking dam are rounded corners or substantially rounded corners. The radius $R_F$ of the rounded corner of the edge of the encapsulation, film satisfies $R_F=L\times\alpha_1$, $\alpha_1$ is a coefficient related to the length of the diagonal of the display substrate, and a value range of $\alpha_1$ is $0.001 \leq \alpha_1 \leq 0.004$; the radius $R_d$ of the rounded corner of the blocking dam satisfies $R_d=L\times\alpha_2$; and $\alpha_1 > \alpha_2$.

In some embodiments, at a same corner position of the display substrate, a corner of the edge of the encapsulation film and a corner of the blocking dam are rounded corners or substantially rounded corners, and the radius of the rounded corner of the edge of the encapsulation film is greater than a radius of the rounded corner of the blocking dam.

In some embodiments. at the same corner position of the display substrate, the radius of the rounded corner of the edge of the encapsulation film is 2 to 10 times the radius of the rounded corner of the blocking dam.

In some embodiments, the display substrate includes: a planarization layer disposed between the encapsulation film and the base substrate, a pixel definition layer disposed between the encapsulation film and the planarization layer, and a photo spacer disposed between the encapsulation film and the pixel definition layer. One of the at least one blocking dam includes at least one of a film layer formed simultaneously with the planarization layer, a film layer formed simultaneously with the pixel definition layer and a film layer formed simultaneously with the photo spacer.

In some embodiments, the at least one blocking darn includes a plurality of blocking dams. and at the same corner position of the display substrate, corners of the plurality of blocking, dams are rounded corners or substantially rounded corners. In a radial direction of the rounded corner of the blocking dam and in a direction from a center of the display substrate to the blocking dam, radii of the rounded corners of the plurality of blocking dams sequentially increase.

In some embodiments, a thickness of, an organic film layer is 1 μm to 20 μm.

In some embodiments, the encapsulation film further includes at least two inorganic film layers. The at least two inorganic film layers and the at least one organic film layer are alternately stacked, and in the encapsulation film, a film layer closest to the base substrate and a film layer farthest from the base substrate are both inorganic film layers. The at least two inorganic film layers cover the at least one blocking dam.

In some embodiments, a thickness of an inorganic film layer is 0.1 μm to 1 μm.

In some embodiments, the encapsulation film further includes at least one buffer organic layer, and one of the at least one buffer organic layer is disposed between an inorganic film layer and an organic film layer that are adjacent.

In some, embodiments, a thickness of a buffer organic layer is 0.1 μm to 0.3 μm.

In some embodiments, the t least one blocking darn includes a first blocking darn and a second blocking dam, the second blocking darn is disposed at a periphery of the first blocking dam, and each corner of the first blocking dam and each corner of the second blocking dam are rounded corners or substantially rounded corners.

In some embodiments, a radius of the rounded corner of the first blocking dam is 200 μm to 280 μm, and a radius of the rounded corner of the second blocking dam is 300 μm to 360 μm. Each corner of the edge of the encapsulation film is a rounded corner or a substantially rounded corner, and a radius of the rounded corner of the edge of the encapsulation film is 360 μm to 440 μm.

In some embodiments, a width of the first blocking dam is 10 μm to 100 μm, and a width of the second blocking dam is 10 μm to 100 μm; and a height of the first blocking dam is 3.5 μm to 6 μm, and a height of the second blocking dam is 3.5 μm to 6 μm.

In another aspect, a display apparatus is provided. The display apparatus includes the display substrate according to any one of the above embodiments,

BRIEF DESCRIPTION OF THE DRAWINGS

In order to describe technical solutions in embodiments of the present disclosure more clearly, the accompanying drawings to be used in the description of embodiments will be introduced briefly below. Obviously, the accompanying drawings to be described below are merely some embodiments of the present disclosure, and a person of ordinary skill in the art can obtain other drawings according to these drawings.

DETAILED DESCRIPTION

The technical solutions in some embodiments of the present disclosure will be described below with reference to the accompanying drawings of some embodiments of the present disclosure. Obviously, the described embodiments are merely some but not all embodiments of the present disclosure. All other embodiments made on the basis of some embodiments of the present disclosure by a person of ordinary skill in the art shall be included in the protection scope of the present disclosure.

With the development of society and advancement of technology, organic ht-emitting diode (OLED) display apparatuses are becoming more and more widely used. According to different driving methods, the organic light-emitting diode display apparatuses include active matrix organic light-emitting diode (AMOLED) display apparatuses and passive matrix organic light-emitting diode (PMOLED) display apparatuses.

Some embodiments of the present disclosure are described by taking an example in which the AMOLED display apparatus is used, but this cannot be regarded as a limitation on the application scope of the technical solutions provided by the present disclosure. In some other embodiments, the technical solutions provided by the present disclosure may also be applied to other display apparatuses except the AMOLED display apparatus. For example, other display apparatuses except the AMOLED display apparatus are micro light-emitting diode (Micro-LED) display apparatuses, mini light-emitting diode (Mini-LED) display apparatuses, etc.

Figure 1:
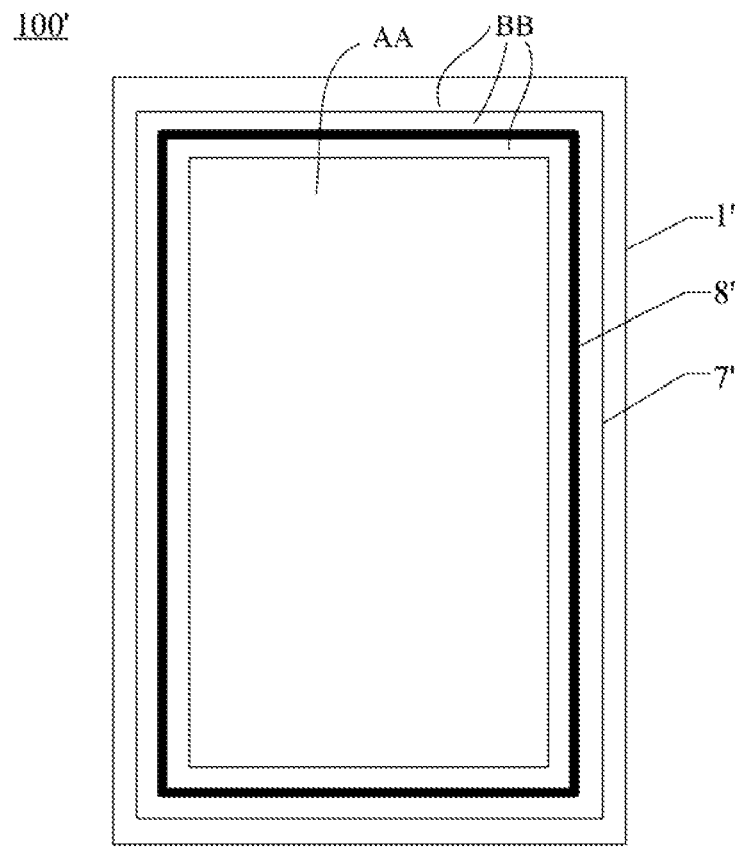
FIG. 1 is a schematic top view of a display substrate in the related art.

As shown in FIG. 1, in the related arts, a display substrate 100' of a display apparatus includes a base substrate 1', a pixel driving circuit disposed on the base substrate 1', an OLED device, a blocking dam 8', etc.; and an encapsulation film 7' covering the aforementioned structures. The display substrate 100' has a display region AA and a bezel region BB surrounding the display region AA. An edge of the encapsulation film 7' for encapsulation is located in the bezel region BB. The encapsulation film 7'may block external moisture and oxygen. However, during testing and actual use of the display substrate 100', due to the deterioration of a sealing performance of the encapsulation film 7', external moisture and oxygen enter the display substrate 100', thereby causing encapsulation of the encapsulation film 7' to fail.

One of the reasons causing the sealing performance of the encapsulation film 7' to deteriorate is that: at corners of the edge of the display substrate 100', the corners of the edge of the encapsulation film 7' are right angles, In a case where the display substrate is subjected to external pressure, squeeze or impact, stress tends to concentrate at tips of the right-angle corners of the edge of the encapsulation film 7' and accumulate, Therefore, local stress at the corners of the edge of the encapsulation film 7' is very large, which causes the encapsulation film 7' to crack, and then causes external moisture and oxygen to enter the inside of the display substrate 100'. As a result, it affects the service life of the display panel.

Figure 2:
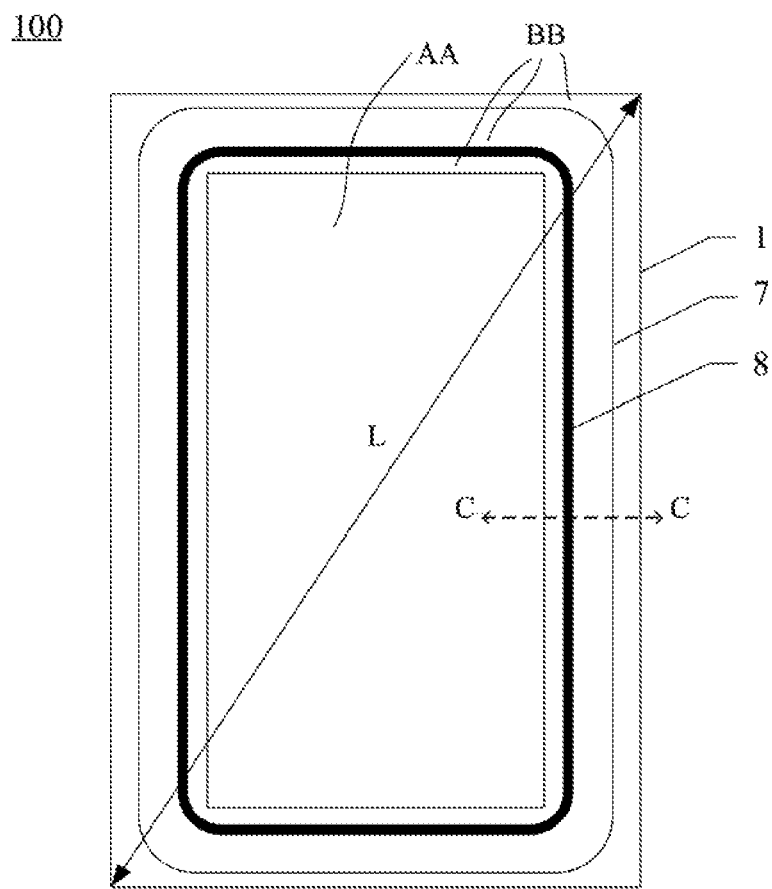
FIG. 2 is a schematic top view of a display substrate, according to some embodiments of the present disclosure.
Figure 3:
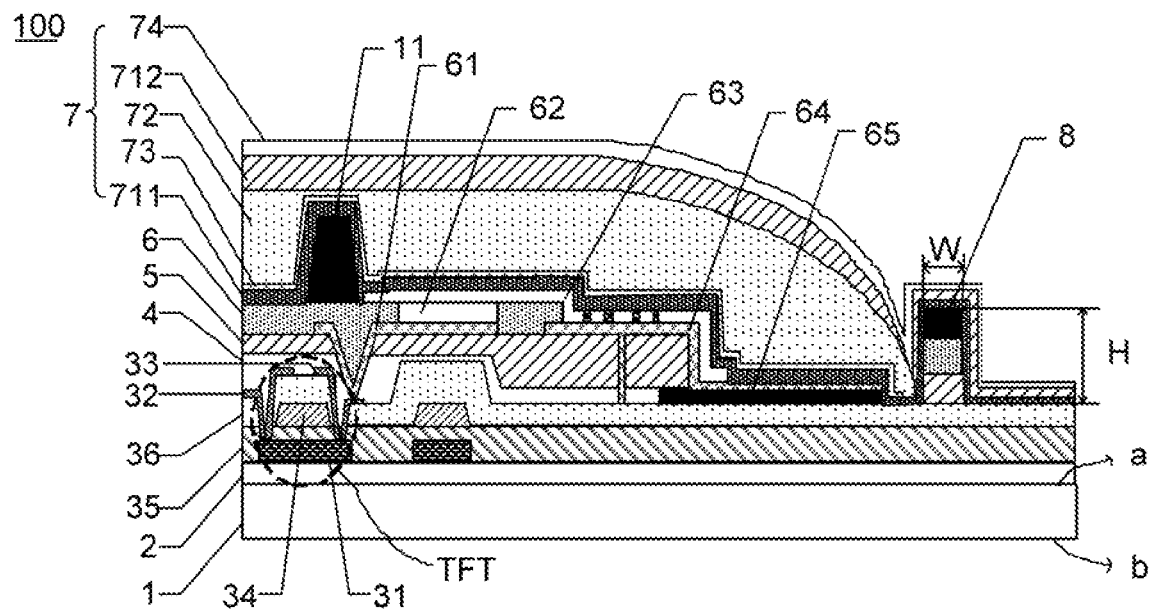
FIG. 3 is a schematic section view of the display substrate in FIG. 2 at section line CC.

On this basis, as shown in FIGS. 2 and 3, some embodiments of the present disclosure provide a display substrate 100. The display substrate 100 includes a base substrate 1 and an encapsulation film 7 disposed at a first side a of the base substrate 1 At least one er of the edge of the encapsulation film 7 is a rounded corner or a substantially rounded corner.

It will be noted that, in this document, the corner of the edge of the encapsulation film 7 is the rounded corner or the substantially rounded corner, which may mean that, at the corner, the edge of the encapsulation film 7 is an arc or a substantially arc. Two straight sides of the encapsulation film 7 at both ends of the arc are tangent to the arc. A radius of the rounded corner is a radius of the arc.

In addition, "the substantially rounded corner" may mean that an arc of "the substantially rounded corner" is a non-absolute smooth arc or a non-standard arc. For example, the non-absolute smooth arc includes an arc having tiny protrusions or depressions, an arc formed by a plurality of short straight lines or curved lines connected end-to-end in accordance with a direction of the arc, etc. For example, the non-standard arc includes an elliptical arc, etc.

In some examples, as shown in FIG. 3, the base substrate 1 includes a first side a and a second side b that are disposed oppositely. The encapsulation film 7 is disposed at the first side a of the base substrate 1.

In this way, a sharp corner (such as a right angle) of the edge of the encapsulation film 7 is eliminated by arranging the corner of the edge of the encapsulation film 7 to be a rounded corner or a substantially rounded corner. In a case where the display substrate 100 is pressed, stress will not accumulate at a certain position of the corner of the edge of the encapsulation film 7, and the rounded corner may make the stress more evenly distribute at different positions of the corner of the encapsulation film 7. It is beneficial to reduce the stress at the corner of the edge of the encapsulation film 7. Moreover, the cracking of the encapsulation film 7 due to excessive stress, which may cause an invasion of moisture and oxygen, may be avoided. In this way, the sealing effect of the encapsulation film 7 may be improved, and the service life of the display substrate 100 may be increased.

In some examples, the edge of the encapsulation film 7 has a plurality of corners, and at least one of the plurality of corners is a rounded corner or a substantially rounded corner. For example, the shape of the display substrate is a rectangle, and the edge of the encapsulation film 7 has four corners. One, two, three, or all of the four corners are rounded corner(s) or substantially rounded corner(s). In a case where all corners of the edge of the encapsulation film 7 are rounded corners or substantially rounded corners, there is no stress concentrating at all corners of the edge of the encapsulation film, Therefore, the sealing effect of the encapsulation film 7 is further improved.

The embodiments of the present disclosure do not limit the number of rounded corners (or substantially rounded corners) of the edge, of the encapsulation film 7. Some embodiments and drawings of the present disclosure illustrate that all corners of the edge of the encapsulation film 7 are rounded corners or substantially rounded corners.

In order to facilitate the subsequent introduction of the embodiments, structures disposed on the base substrate 1 is first described below. Obviously, the specific structure introduced may not constitute a limitation on the structure of the display substrate 100 in the embodiments of the present disclosure. Based on the inventive concept of the present disclosure, all other embodiments obtained by a person of ordinary skill in the art shall be included in the protection scope of the present disclosure.

In some embodiments, as shown in FIG. 3 the display substrate 100 includes a base substrate 1, a buffer layer 2 formed on the base substrate 1, and pixel driving circuits formed on the buffer layer 2 and arranged in an array. Each pixel driving circuit includes a plurality of thin film transistors (TFT) and at least one capacitor. The present disclosure does not limit the type of the thin film transistors. For example, the thin film transistor is a top-gate thin film transistor, a bottom-gate thin film transistor (as shown in FIG. 3) or a double-gate thin film transistor. In an example where the thin film transistor is a bottom-gate thin film transistor shown in FIG. 3, the thin film transistor includes an active layer 31, a gate 34, a source 32 and a drain 33 connected to the active layer 31, a gate insulating layer 35 that isolates the gate 34 from the active layer 31, and an inter level dielectric (ILD) layer 36 that isolates the gate 34 from the source 32 and the drain 33. In some other embodiments, the display substrate 100 does not include the buffer layer 2.

In some examples, as shown in FIG. 3, the display substrate 100 further includes a passivation layer 4 and, a planarization (PLN) layer 5 of the pixel driving circuit that are sequentially stacked on top of one another. Via holes ere provided in the passivation layer 4 and the planarization layer 5 at a position corresponding to the drain 33 of the thin film transistor TFT. The display substrate 100 further includes an anode layer 61 disposed on a side of the planarization layer 5 away from the base substrate 1. The anode layer 61 is electrically connected to the drain 33 of the thin film transistor TFT through the via holes. In some other examples, the display substrate 100 may include one of the passivation layer 4 and the planarization layer 5. In this case, the via hole for electrically connecting the anode layer 61 and the drain 33 of the thin film transistor TFT is only disposed in one of the passivation layer 4 and the planarization layer 5. In some other examples, the display substrate 100 may, not include the passivation layer 4 and the planarization layer 5, and the anode layer 61 i.s electrically connected to the drain 33 of the thin film transistor TFT directly.

In some examples, with continued reference to FIG. 3, the display substrate 100 further includes a pixel definition layer (PDL) 6 disposed on a side of the anode layer 61 away from the base substrate 1. The pixel definition layer 6 is provided with openings. The display substrate 100 further includes an organic functional layer that is formed in the openings and provided with OLED devices. The organic functional layer includes an organic light-emitting layer 62, and may also include at least one of a hole injection layer, a hole transport layer, an electron transport layer, an electron infection layer, etc. The display substrate 100 further includes a cathode layer 63 disposed on a side of the organic light-emitting layer 62 and a side of the pixel definition layer 6 that are away from the base substrate 1. The cathode layer 63 is electrically, connected to a cathode wiring 65 through a cathode lap-joint layer 64. In some other examples, with continued reference to FIG. 3, the display substrate 100 further includes a photo spacer (PS) 11 disposed on a side of the pixel definition layer 6 away from the base substrate 1.

For example, the organic light-emitting layer 62 may be an organic light-emitting layer capable of emitting red (R) light, an organic light-emitting layer capable of emitting green (G) light, or an organic light-emitting layer capable of emitting blue (B) light. For another example, the organic light-emitting layer 62 may be an organic light-emitting layer capable of emitting white light. In this case, the display substrate 100 further includes a color filter layer, and the color filter layer includes filter portions of multiple colors (such as a filter portion of red color, a filter portion of green color, and a filter portion of blue color) to filter white light emitted by the organic light-emitting layer 62.

In some embodiments, as shown in FIG. 2, the corner of the edge of the encapsulation film 7 is a rounded corner a radius $R_F$ of which satisfies:

$$R_F = L \times \alpha_1.$$

Where L is a length of a diagonal of the display substrate 100, and $\alpha_1$ is a coefficient related to the length of the diagonal of the display substrate 100, It will be noted that, for example, as shown in FIG. 2, the shape of the display substrate 100 is a rectangle, and the diagonal of the display substrate 100 is a line segment between two diagonal vertexes of the display substrate 100. For another example, the shape of the display substrate 100 is a rectangle having rounded corners, and the diagonal of the display substrate 100 is a line segment between the midpoints of the arcs of the two diagonal rounded corners of the display substrate 100.

In some embodiments, a value of $\alpha_1$ is positively related to the length of the diagonal of the display substrate 100. That is, the longer the length of the diagonal of the display substrate 100 is, the greater the value of $\alpha_1$ is. For example, the value of $\alpha_1$ is 0.000005 to 0.000015 times the length of the diagonal of the display substrate 100. For example, the value of $\alpha_1$ is 0.00001 times the length of the diagonal of the display substrate 100. It will be noted that the present disclosure does not limit the length of the diagonal of the display substrate 100 and a unit of the length. Exemplarily, the length of the diagonal of the display substrate 100 is 50 mm to 800 mm (for example, the length of the diagonal of the display substrate 100 is 50 mm to 500 mm), In some examples, the value range of a is $0.001 \leq \alpha_1 \leq 0.004$. For example, the length of the diagonal of the display substrate 100 is 100 mm to 400 mm. According to a multiple relationship between the value of $\alpha_1$ and the length of the diagonal of the display substrate 100 (for example, the value of $\alpha_1$ is 0.00001 times the length of the diagonal of the display substrate 100), the value range of $\alpha_1$ is $0.001 \leq \alpha_1 \leq 0.004$.

For example, a length L of the diagonal of the display substrate 100 is 200 mm, the value of $\alpha_1$ is 0.001, and the radius $R_F$ of the corner of the edge of the encapsulation film 7, which is a rounded corner, is 200 µm. Or, the length L of the diagonal of the display substrate 100 is 150 mm, the value of $\alpha_1$ is 0.002, and the radius $R_F$ of the corner of the edge of the encapsulation film 7, which is a rounded corner, is 300 µm. Or, the length L of the diagonal of the display substrate 100 is 100 mm, the value of $\alpha_1$ is 0.004, and the radius $R_F$ of the corner of the edge of the encapsulation film 7, which is a rounded corner, is 400 µm.

In some embodiments, as shown in FIGS. 2 and 3, the encapsulation film 7 includes at least one organic film layer 72. The display substrate 100 further includes at least one blocking dam 8 disposed at the first side a of the base substrate 1. The at least one blocking, dam 8 is disposed around the at least one organic film layer 72. The at least one blocking dam 8 is configured to block the organic film layer 72. At least one corner of the blocking dam 8 is a rounded corner or a substantially rounded corner.

In some embodiments, a material of the organic film layer 72 is a flexible material, For example, the material of the organic film layer 72 is an acrylic polymer, a silicon-based polymer, an epoxy-based polymer, etc. This is convenient to realize the flexible function of the encapsulation film 7 and the display substrate 100 For example, in a case where the material of the base substrate 1 is a flexible material, the display substrate 100 composed of the encapsulation film 7 including the organic film layer 72 is a flexible display substrate.

In some embodiments, a thickness of the organic film layer 72 is 1 µm to 20 µm. For example, the thickness of the organic film layer 72 is 1 µm to 5 µm; 5 µm to 10 µm, 10 µm to 15 µm, 15 µm to 20 µm, etc.

In some embodiments, a method of manufacturing the organic film layer 72 may be an ink jet printing (IJP) method, a polymer monomer deposition method, a plasma enhanced chemical vapor deposition (PECVD) method, a spin coating method, a spray coating method, etc. In addition, when the organic film layer 72 is provided, the organic film layer 72 may be cured through thermal curing, photo-curing, or thermal curing in combination with photo-curing.

For example, the method of manufacturing the organic film layer 72 is the ink jet printing (IJD) method. The ink jet printing method may reduce the material cost of manufacturing the organic film layer 72 and improve production efficiency of the organic film layer 72.

On this basis, by arranging at least one blocking dam 8 around the organic film layer 72, it may effectively block the overflow of the material of the organic film layer when the organic film layer 72 is prepared by the ink jet printing method.

In some embodiments, as shown in FIG. 3, the insulating film layers of the display substrate 100 (such as the planarization layer 5, the photo spacer 11 and the pixel definition layer 6) are formed; meanwhile, the blocking dam 8 is formed layer by layer through processes such as etching. That is, the blocking dam 8 includes one or more of materials of the insulating film layers, such as a material of the planarization layer, a material of the pixel definition layer, and a material of the photo spacer.

In some examples, as shown in FIG. 3, a width W of the blocking dam S is 10 µm to 100 µm, and a height H of the blocking dam 8 is 3.5 µm to 6 µm. For example, the planarization layer 5, the pixel definition layer 6 and the photo spacer 11 are formed; meanwhile, the blocking dam is formed, The material of the planarization layer 5 is an acrylic material (PMMA, chemical name of which is polym-ethyl methacrylate), and a thickness of the planarization layer 5 is 1.5 µm to 2.5 µm. The material of the pixel definition layer 6 is polyimide, and a thickness of the pixel definition layer 6 is 1 µm to 2 µm. The material of the photo spacer 11 is polyimide, and a thickness of the photo spacer may be 1 µm to 1.5 µm. Therefore, a height H of the blocking dam 8 is 3.5 µm to 6 µm.

In some examples, as shown in FIG. 3 the width W of the blocking dam 8 is 10 µm to 100 µm, and the height H of the blocking dam 8 is 3.5 µm to 6 µm.

In some examples, the blocking dam 8 is formed through a photolithography process. In a case where the blocking dam 8 is formed by stacking some film layers (for example, a film layer in the planarization layer, a film layer in the pixel definition layer, etc.), and during the forming of each film layer of the blocking dam 8, first, a corresponding layer is coated with a photosensitive organic material (such as photoresist); then, a mask with corner pattern(s) to be formed is used to expose and develop the coating of the photosensitive organic material, so as to make the coating of the photosensitive organic material have the corner pattern (s) to be formed; afterwards, the coating of the photosensitive organic material is used for the etching of the corresponding layer, so as to make the corresponding layer form the corner(s) of the blocking dam 8 that are to be formed and are rounded corner(s) or substantially rounded corner(s).

In some other examples in the case where the blocking dam 8 is formed by stacking some film layers (for example, a layer in the planarization layer, a film layer in the pixel definition layer, etc.), and when each film layer of the blocking dam 8 is formed, layers (including the corresponding film layer in the blocking dam 8) having different thicknesses may be formed in different regions of the display substrate through a gray tone mask technology (or a half tone mask technology), so that the thickness of the corresponding film layer in the blocking dam 8 is different from the thickness of film layer in other region of the display substrate. For example, the half tone mask technology is used to form the pixel definition layer having a thickness of X in the display region AA and the corresponding film layer in the blocking dam 8 having a thickness of Y in the bezel region BB. In this way, the height of the blocking dam 8 may be controlled precisely, and additional process steps may be reduced.

Figure 4:
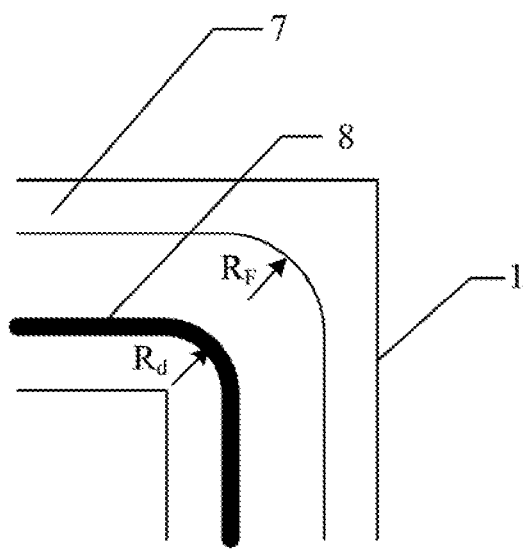
FIG. 4 is a partially schematic diagram of a corner of an edge of a display substrate, according to some embodiments of the present disclosure.

In some embodiments, as shown in FIGS. 2 and 4, a shape of the display substrate 100 is a rectangle, and a radius $R_d$ of the rounded corner of the blocking dam 8 satisfies:

$R_d = L \times \alpha_2.$

Where L is the length of the diagonal of the display substrate 10 and $\alpha_2$ is a coefficient related to the length of the diagonal of the display substrate 100.

In some embodiments, a value of $\alpha_2$ is positively related to the length of the diagonal of the display substrate 100. That is, the longer the length of the diagonal of the display substrate 100 is, the greater the value of $a_2$ is. For example, the value of $\alpha_2$ is 0.000005 to 0.000015 times the length of the diagonal of the display substrate 100. For example, the value of $\alpha_2$ is 0.00001 times the length of the diagonal of the display substrate 100. It will be noted that the present disclosure does not limit the length of the diagonal of the display substrate 100 and the unit of the length. For example, the length of the diagonal of the display substrate 100 is 50 mm to 800 mm (for example, the length of the diagonal of the display substrate 100 is 50 mm to 500 mm).

Figure 5:
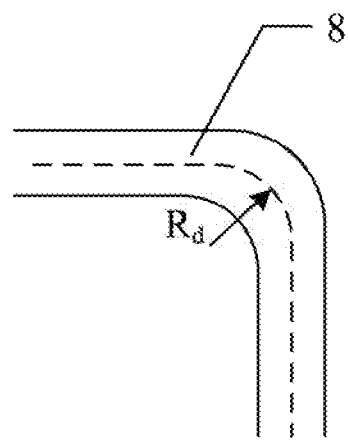
FIG. 5 is a partially schematic diagram of a corner of a blocking dam, according to some embodiments of the present disclosure.

Herein as shown in FIGS. 4 and 5, the blocking dam 8 has a certain width, so the corner of the blocking dam 8 may be a corner of the central axis of the blocking dam 8 in circumferential direction (shown by the dotted lines in FIG. 5). For example, in a case where the corner of the blocking dam 8 is a rounded corner, the radius $R_d$ of the rounded corner is a radius of the corner of the central axis of the blocking dam 8. For another example, in the case here the corner of the blocking dam 8 is a rounded corner, the radius $R_d$ of the rounded corner is a radius of a rounded corner defined by an inner edge of the blocking dam 8 or a radius of a rounded corner defined by an outer edge of the blocking dam 8.

In some examples, the value range of $\alpha_2$ is $0.001 \leq a_2 \leq 0.004$. For example, the length of the diagonal of the display substrate 100 is 100 mm to 400 mm. According, to a relationship between the value of $\alpha_2$ and the length of the diagonal of the display substrate 100 (for example, the value of $\alpha_2$ is 0.00001 times the length of the diagonal of the display substrate 100) the value range of $\alpha_2$ is $0.001 \leq \alpha_2 \leq 0.004$.

For example, the length L of the diagonal of the display substrate 100 is 150 mm, the value of $a_2$ is 0.001, and the radius $R_d$ of the corner of the at least one blocking dam 8, which is a rounded corner, is 150 μm. Or, the length L of the diagonal of the display substrate 100 is 100 mm, the value of $\alpha_2$ is 0.003, and the radius $R_d$ of the rounded corner of the at least one blocking dam 8, which is a rounded corner, is 300 μm. Or, the length L of the diagonal of the display substrate 100 is 100 mm the value of $\alpha_2$ is 0.004, and the radius $R_d$ of the rounded corner of the at least one blocking dam 8, which is a rounded corner, is 400 μm.

In some examples, the blocking dam 8 has a plurality of corners, and at least one of the plurality of corners is a rounded corner or a substantially rounded corner. For example, the shape of the display substrate is a rectangle, and the edge of the blocking dam 8 has four corners. One, two, three, or all of the four corners are rounded corner(s) or substantially rounded corner(s). The embodiments of the present disclosure do not limit the number of rounded corners (or substantially rounded corners) of the edge of the blocking dam 8. Some embodiments and drawings of the present disclosure illustrate that all corners of the edge of the blocking dam 8 are rounded corners or substantially rounded corners.

In some embodiments, as shown in FIG. 4, at the same corner position of the display substrate 100, the corner of the edge of the encapsulation film 7 and the corner of the blocking dam 8 are rounded corners or substantially rounded corners, The radius of the rounded corner of the edge of the encapsulation film 7 is greater than the radius of the rounded corner of the blocking dam 8. Therefore, the encapsulation film 7 has a certain width at a side of the blocking dam 8 farthest from the center of the display substrate 100, which may ensure that the encapsulation film 7 has a good encapsulation effect. Herein, the center of the display substrate 100 is an intersection of two diagonals in a case where the shape of display substrate 100 is a rectangle.

In some embodiments, at the same corner position of the display substrate 100. the corner of the edge of the encapsulation film 7 and the corner of the blocking dam 8 are rounded corners or substantially rounded corners. In a case where a radius $R_F$ of the rounded corner of the edge of the encapsulation film 7 satisfies $R_F = L \times \alpha_1$, and the radius $R_d$ of the rounded corner of the blocking dam 8 satisfies $R_d = L \times \alpha_2$, $\alpha_1 > \alpha_2$. In a case where the corner of the edge of the encapsulation film 7 and the corner of the blocking dam 8 are rounded corners, the radius of the rounded corner of the edge of the encapsulation film 7 is greater than the radius of the corner of the blocking dam 8. In this way, the encapsulation film 7 has a certain width at a side of the blocking dam 8 farthest from the center of the display substrate 100, which may ensure that the encapsulation film 7 has a good encapsulation effect.

In some embodiments, at the same corner position of the display substrate 100, the radius of the rounded corner of the edge of the encapsulation film 7 is 2 to 10 times the radius of the rounded corner of the blocking dam 8. In this way, the blocking dam 8 may effectively block the ink overflow when the organic film layer 72 is prepared by the ink jet printing method, and it is ensured that the encapsulation film 7 has a larger width at a side of the blocking dam 8 farthest from the center of the display substrate 100, and the encapsulation film 7 may have a better encapsulation effect.

In some embodiments. the number of the at least one blocking dams 8 is multiple. At the same corner position of the display substrate 100, corners of the blocking dams 8 are all rounded corners or substantially rounded corners. Moreover, in a radial direction of the rounded corner of the blocking dam 8 and in a direction from the center of the display substrate 100 to the blocking dam 8, the radii of the rounded corners of the blocking dams 8 sequentially increase. In this way, there may be a certain width between the blocking dams 8, which may effectively block the overflow of the material of the organic film layer when the organic film layer 72 is prepared by the ink jet printing method.

Figure 6:
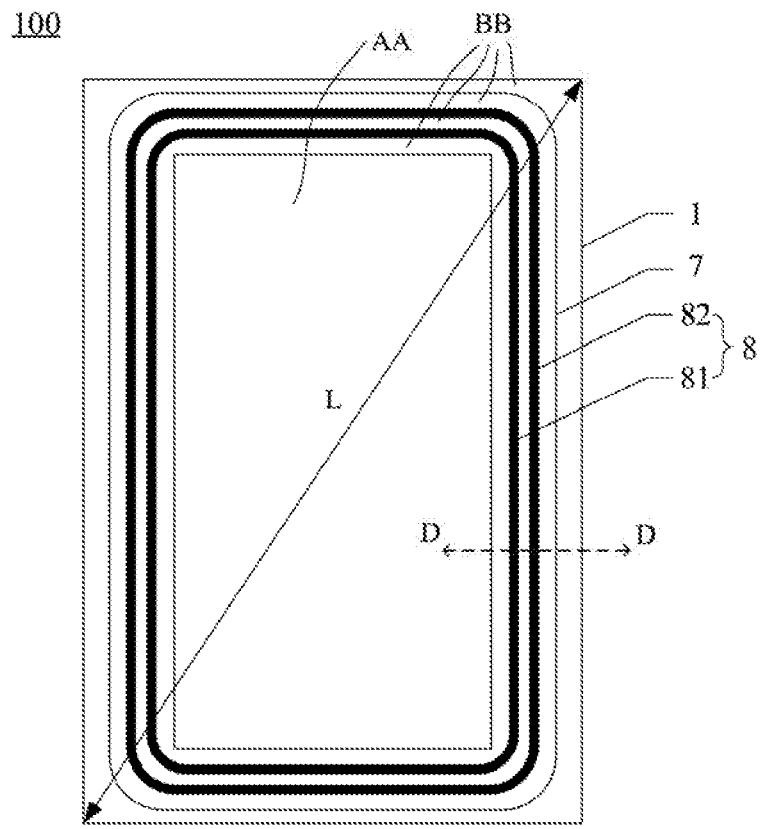
FIG. 6 is a schematic top view of another display substrate, according to some embodiments of the present disclosure.

For example, the number of the, at least one blocking dam 8 is two. As shown in FIG. 6, the display substrate 100 includes a first blocking dam 81 and a second blocking dam 82, and the second blocking dam 82 is disposed at the periphery of the first blocking dam 81. Each corner of the first blocking dam 81 and each corner of the second blocking dam 81 are rounded corners or substantially rounded corners. The arrangement of two blocking dams 8 may effectively block the organic film layer 72 without significantly increasing a width of the bezel region BB of the display substrate 100.

Figure 7:
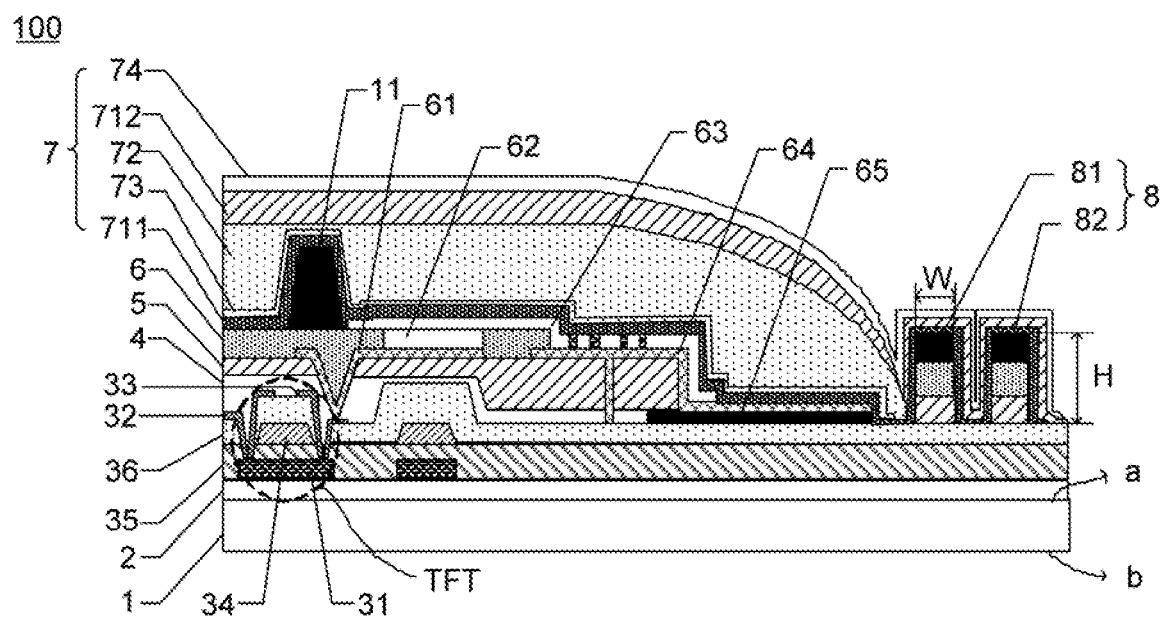
FIG. 7 is a schematic section view of the display substrate in FIG. 6 at section line DD.

In some embodiments, a radius of the rounded corner of the first blocking dam 81 is 200 μm to 280 μm, and a radius of the rounded corner of the second blocking dam 82 is 300 μm to 360 μm. Each corner of the edge of the encapsulation film 7 is a rounded corner or a substantially rounded corner, and the radius of the rounded corner of the edge of the encapsulation film 7 is 360 μm to 440 μm. For example, the radius of the rounded corner of the first blocking dam 81 is 240 μm, the radius of the rounded corner of the second blocking dam 82 is 330 μm, and the radius of the rounded corner of the edge of the encapsulation film 7 is 400 μm. Or, the radius of the rounded corner of the first blocking dam 81 is 200 μm, the radius of the rounded corner of the second blocking dam 82 is 300 μm, and the radius of the rounded corner of the edge of the encapsulation film 7 is 360 μm, Or, the radius of the rounded corner of the first blocking dam 81 is 280 μm, the radius of the rounded corner of the second blocking dam 82 is 360 μm, and the radius of the rounded corner of the edge of the encapsulation film 7 is 440 μm, In some embodiments, as shown in FIG. 7, the encapsulation film 7 further includes at least two inorganic film layers. The inorganic film layers and the organic film layer(s) 72 are alternately stacked. In the encapsulation film 7, both a film layer closest to the base substrate 1 and a film layer farthest from the base substrate 1 are inorganic film layers. At least two inorganic film layers cover the at least one blocking dam 8.

In some embodiments, a material of the inorganic film layer is ,a material that may block moisture and oxygen. It is ensured that the encapsulation film 7 may prevent the invasion of moisture and oxygen, and thereby it is ensured that the encapsulation film 7 has a good sealing effect. For example, the material of the inorganic film layer is silicon nitride (SiNx), silicon dioxide (SiO2), silicon oxynitride (SiON) or aluminum oxide (AlOx).

In some embodiments, a thickness of the inorganic film layer is 0.1 μm to 1 μm. For example, the thickness of the inorganic film layer is 0.1 μm, 0.3 μm, 0.5 μm or 1 μm.

In some embodiments, a method of manufacturing the inorganic film layer is a chemical vapor deposition (CVD) method, a physical vapor deposition (PVD) method or an atomic layer deposition (ALD) method.

In some examples, the edge of the encapsulation film 7 is, an edge of an inorganic film layer. Since at least one corner of the edge of the encapsulation film 7 is a rounded corner or a substantially rounded corner, at least one corner of the edge of the inorganic film layer is a rounded corner or a substantially rounded corner.

In some examples, the inorganic film layer is manufactured through the photolithography process. During the manufacturing of the inorganic film layer, first, the inorganic film layer is coated with a photosensitive organic material (such as photoresist); then, a mask with corner pattern(s) to be formed is used to expose and develop the coating of the photosensitive organic material, so that the coating of the photosensitive organic material has the corner pattern(s) to be formed; afterwards, the coating of the photosensitive organic material is used for the etching of the inorganic film layer, so that the corner(s) of the edge of the inorganic film layer are formed to be rounded corner(s) or substantially rounded corner(s).

In some other examples, during the manufacturing of the inorganic film layer, film layers (including the inorganic film layer) having different thicknesses may be formed in different regions of the display substrate through the gray tone mask technology (or the half tone mask technology). In this way, the thickness of the inorganic film layer may be controlled precisely, and shape(s) of the corner(s) of the edge of the inorganic film layer that are rounded corner(s) or substantially rounded corner(s) may be controlled precisely, and additional process steps may be reduced.

In some embodiments, the encapsulation film 7 has a structure of at least three layers. With respect to an encapsulation film 7 having a certain number of layers, both a film layer closest to the base substrate 1 and a film layer farthest from the base substrate 1 are inorganic film layers, so that the encapsulation film 7 plays a role of blocking moisture and oxygen. In addition the inorganic film layers and the organic film layer(s) are alternately stacked, so as to realize the flexible function of the organic film layer in the encapsulation film 7 and the display substrate 100. Some embodiments of the present disclosure do not limit the number of film layers in the encapsulation film 7, and the description will be made below by taking, an example in which the encapsulation film 7 has a three-layer structure.

For example, the encapsulation film 7 includes one organic film layer and two inorganic film layers. As shown in FIG. 7, the encapsulation film 7 includes a first inorganic film layer 711, an organic film layer 72 and a second inorganic film layer 712 that are alternately stacked on top of one another. In the encapsulation film 7, the first inorganic film layer 7111 st to the base substrate 1, the second inorganic film layer 712 is farthest from the base substrate 1, and the organic film layer 72 i located between the first inorganic film layer 711 and the second inorganic film layer 712.

In some embo iments, each inorganic film layer of the encapsulation film 7 covers each blocking dam 8. That is, the blocking dam 8 is located on a side of the encapsulation film 7 proximate to the base substrate 1. An orthographic projection of the blocking dam 8 on the base substrate 1 is within a range of an orthographic projection of the;encapsulation film 7 on the base substrate 1.

In some embodiments, the encapsulation film 7 further includes at least one buffer organic layer. The at least one buffer organic layer is disposed between the inorganic film layer and the organic film layer that are adjacent. An orthographic projection of the buffer organic layer on the base substrate 1 is within a range of an orthographic projection of the organic film layer on the base substrate 1. Or, the orthographic projection of the buffer organic layer on the base substrate 1 coincides with the orthographic projection of the organic film layer on the base substrate 1. The buffer organic layer is beneficial to reduce a difference between the inorganic film layer and the, organic film layer. The difference refers to the difference in density, structure, adhesion, stress, etc. between different film layers.

For example, as shown in FIG. 7, a buffer organic layer 73 is disposed between the first inorganic film layer 711 and the organic film layer 72, and there is no buffer organic layer between the organic film layer 72 and the second inorganic film layer 712. Or, a buffer organic layer 73 is disposed between the first inorganic film layer 711 and the organic film layer 72, and a buffer organic layer 73 is disposed between the organic film layer 72 and the second inorganic film layer 712. Some embodiments of the present disclosure do not limit the number of the buffer organic layers.

In some examples, a method of manufacturing the buffer organic layer is the same as the method of manufacturing the inorganic film layer. Or, the method of manufacturing the buffer organic layer is the same as a method of manufacturing the organic film layer, In a case where the buffer organic layer and the inorganic film layer are manufactured through the same method, the buffer organic layer and the inorganic film layer may be manufactured in a same process chamber, In a case where the buffer organic layer and the organic film layer are manufactured through the same method, the buffer organic layer arid the organic film layer may be manufactured in a same process chamber, Herein, the process, chamber is a vacuum device for manufacturing the film layers, and methods of manufacturing different film layers correspond to different process chambers. Therefore, the method of manufacturing the buffer organic layer may be selected according to the scheduling situation of the equipment in the production line, In this way, processes may be continuous, time for transferring and aligning the substrate may be reduced, and there are no undesirable defects in an interface between the film layers, thereby obtaining better films.

For example, after the first inorganic film layer 711 is manufactured, when the buffer organic layer 73 is to be manufactured, the process chamber for manufacturing the buffer organic layer 73 is determined according to the scheduling situation of the equipment in the production line. For example, according to the scheduling situation of the equipment in the production line, if a time interval between the manufacturing of the first inorganic film layer 711 and the manufacturing of the organic film layer 72 is short, the buffer organic layer 73 is manufactured in a process chamber where the first inorganic film layer 711 is manufactured. If the time interval between the manufacturing, of the first inorganic film layer 711 and the manufacturing of the organic film layer 72 is long, the buffer organic layer 73 is manufactured in a process chamber where the organic film layer 72 is manufactured, Therefore, it may be ensured that the time interval between the manufacturing of the buffer organic layer and the manufacturing of the organic film layer is short, and a surface of the buffer organic layer 73 has a good characteristic of a contact angle. Herein, the contact angle is a measurement of a wetness degree of the film layer.

In some embodiments, when the buffer organic layer 73 is manufactured, plasma (for example, oxygen-containing plasma, and fluorine-containing plasma) is injected into the process chamber for manufacturing the buffer organic layer 73 to solidify the buffer organic layer 73, thereby achieving precise and timely control on surface characteristics of the films.

In some examples, in a case where the buffer organic layer 73 manufactured through the ink jet printing method, and the buffer organic layer 73 is cured, regional operation is performed on them buffer organic layer 73, For example, a concentration of plasma injected to a central region of the buffer organic layer 73 is higher than a concentration of pies la injected to an edge region of the buffer organic layer 73, thereby preventing the edge of the ink in the ink jet printing process from being uneven and flowing. Or, the oxygen-containing plasma is injected to the central region of the buffer organic layer 73, and the fluorine-containing plasma is injected to the edge region of the buffer organic layer 73. Due to the good hydrophilicity of the oxygen-containing plasma and the good hydrophobicity of the fluorine-containing plasma, that the edge of the ink in the ink jet printing process is uneven and flowing may be prevented.

In some embodiments, a thickness of the buffer organic layer is relatively thin. For example, the thickness of the buffer organic layer is 0.1 μm to 0.3 μm. The thin buffer organic layer may reduce the difference between the inorganic film layer and the organic film layer; moreover, in the manufacturing process, the deposition time of the thin buffer organic layer is short, and it is beneficial for cleaning the mask used for evaporating the buffer organic layer.

In some embodiments, a material of the buffer organic layer is plasma-polymerization hexamethyldisiloxane (HMD O).

In some embodiments, the encapsulation film 7 further includes a barrier layer 74. The barrier layer 74 covers the inorganic film layer farthest from the base substrate 1. A material of the barrier layer 74 is a flexible material to protect the entire encapsulation structure. For example, the material of the barrier layer 74 is polyethylene terephthalate (PET) or poly(ethylene naphthalate) (PEN).

Figure 8:
FIG. 8 is a schematic top view of a display apparatus, according to some embodiments of the present disclosure.

Some embodiments of the present disclosure provide a display apparatus 200. As shown in FIG. 8, the display apparatus 200 includes the display substrate 100 provided by any of the foregoing embodiments. In addition, in some examples. the display apparatus 200 further includes a mainboard coupled to the display substrate 100. The mainboard is configured to control the display apparatus 200 to make the display apparatus, realize various functions. In some other examples, the display apparatus 200 may include a touch screen to be used in conjunction with the display substrate 100, and the touch screen is configured to realize operations to the display apparatus 200.

For example, the display apparatus 200 is an OLED display apparatus, an AMOLED display apparatus, a Micro-LED display apparatus, a Mini-LED display apparatus, etc.

For example, the display apparatus may be any apparatus that displays moving images (for example, a video), fixed images (for example, a static image), content or graphical images More specifically, it is anticipated that the described embodiments may be implemented in or associated with a plurality of electronic devices. The plurality of the electronic devices may include but not limit to: mobile phones, wireless devices, portable android devices (PAD), hand-held or portable computers, global positioning system (GPS) reciversinavigators, cameras, moving picture experts group 4 (MP4) video players, video cameras, game consoles, watches, clocks, calculators, TV monitors. flat panel displays, computer monitors, car displays (e.g., an odometer display, etc.), navigators, displays for camera view (e.g., a display for a rear view camera vehicle), electronic photos, electronic billboards or direction boards, projectors, building structures, packaging and aesthetic structures (e,g., a display for an image of a piece of jewelry), etc.

The beneficial effects achieved by the display apparatus 200 provided by the embodiments of the present disclosure are the same as the beneficial effects achieved by the display substrate 100, which will not be described herein again, The forgoing descriptions are merely specific implementation manners of some embodiments of the present disclosure, but the protection scope of some embodiments of the present disclosure is not limited thereto Any changes or replacements that a person skilled in the art could conceive of within the technical scope of some embodiments of the present disclosure shall be included in the protection scope of the present disclosure. Therefore, the protection scope of some embodiments of the present disclosure shall be subject to the protection scope of the claims.

What is claimed is:
1. A display substrate, comprising:
a base substrate, and
an encapsulation film disposed at a first side of the base substrate, wherein at least one corner of an edge of the encapsulation film is a rounded corner or a substantially rounded corner, wherein
a radius $R_F$ of the rounded corner of the edge of the encapsulation film satisfies:

$$R_F = L \times \alpha_1,$$

where L is a length of a diagonal of the display substrate, and $\alpha_1$ is a coefficient related to the length of the diagonal of the display substrate.

2. The display substrate according to claim 1, wherein a value range of $\alpha_1$ is $0.001 \leq \alpha_1 \leq 0.004$.

3. The display substrate according to claim 1, wherein the encapsulation film includes at least one organic film layer;
the display substrate has a display region and a bezel region surrounding the display region, the display substrate further comprises at least one blocking dam disposed at the first side of the base substrate in the bezel region, the at least one blocking dam is disposed around the at least one organic film layer, and each blocking dam of the at least one blocking dam is configured to block the at least one organic film layer; and
at least one corner of the blocking dam is a rounded corner or a substantially rounded corner.

4. The display substrate according to claim 3, a radius $R_d$ of the rounded corner of the blocking dam satisfies:

$$R_d = L \times \alpha_2,$$

where $\alpha_2$ is the coefficient related to the length of the diagonal of the display substrate.

5. The display substrate according to claim 4, wherein a value range of $\alpha_2$ is $0.001 \leq \alpha_2 \leq 0.004$.

6. The display substrate according to claim 5, wherein at a same corner position of the display substrate, a corner of the edge of the encapsulation film and a corner of the blocking dam are rounded corners or substantially rounded corners; and
a value range of $\alpha_1$ is $0.001 \leq \alpha_1 \leq 0.004$; and $\alpha_1 > \alpha_2$.

7. The display substrate according to claim 6, wherein at the same corner position of the display substrate, the radius of the rounded corner of the edge of the encapsulation film is 2 to 10 times the radius of the rounded corner of the blocking dam.

8. The display substrate according to claim 6, wherein the at least one blocking dam includes a plurality of blocking dams, and at the same corner position of the display substrate, corners of the plurality of blocking dams are rounded corners or substantially rounded corners; and
in a radial direction of the rounded corner of the blocking dam and in a direction from a center of the display substrate to the blocking dam, radii of the rounded corners of the plurality of blocking dams sequentially increase.

9. The display substrate according to claim 3, wherein a thickness of an organic film layer is 1 μm to 20 μm.

10. The display substrate according to claim 3, wherein the encapsulation film further includes at least two inorganic film layers;
the at least two inorganic film layers and the at least one organic film layer are alternately stacked, and in the encapsulation film, a film layer closest to the base substrate and a film layer farthest from the base substrate are both inorganic film layers; and
the at least two inorganic film layers cover the at least one blocking dam.

11. The display substrate according to claim 10, wherein a thickness of an inorganic film layer is 0.1 μm to 1 μm.

12. The display substrate according to claim 10, wherein the encapsulation film further includes at least one buffer organic layer, and one of the at least one buffer organic layer is disposed between an inorganic film layer and an organic film layer that are adjacent.

13. The display substrate according to claim 12, wherein a thickness of a buffer organic layer is 0.1 μm to 0.3 μm.

14. The display substrate according to claim 3, wherein the at least one blocking dam includes a first blocking dam and a second blocking dam, the second blocking dam is disposed at a periphery of the first blocking dam, and each corner of the first blocking dam and each corner of the second blocking dam are rounded corners or substantially rounded corners.

15. The display substrate according to claim 14, wherein a radius of the rounded corner of the first blocking dam is 200 μm to 280 μm, and a radius of the rounded corner of the second blocking dam is 300 μm to 360 μm; and
each corner of the edge of the encapsulation film is a rounded corner or a substantially rounded corner, and a radius of the rounded corner of the edge of the encapsulation film is 360 μm to 440 μm.

16. The display substrate according to claim 14, wherein a width of the first blocking dam is 10 μm to 100 μm, and a width of the second blocking dam is 10 μm to 100 μm; and a height of the first blocking dam is 3.5 μm to 6 μm, and a height of the second blocking dam is 3.5 μm to 6 μm.

17. A display apparatus, comprising the display substrate according to claim 1.

18. The display substrate according to claim 3, comprising:
a planarization layer disposed between the encapsulation film and the base substrate,
a pixel definition layer disposed between the encapsulation film and the planarization layer, and
a photo spacer disposed between the encapsulation film and the pixel definition layer,
wherein one of the at least one blocking dam includes at least one of a film layer formed simultaneously with the planarization layer, a film layer formed simultaneously with the pixel definition layer and a film layer formed simultaneously with the photo spacer.

\* \* \* \* \*